United States Patent [19]

Weber

[11] 4,436,985

[45] Mar. 13, 1984

[54] APPARATUS FOR HEAT TREATING SEMICONDUCTOR WAFERS

[75] Inventor: T. Jerome Weber, Mt. View, Calif.

[73] Assignee: GCA Corporation, Bedford, Mass.

[21] Appl. No.: 373,978

[22] Filed: May 3, 1982

[51] Int. Cl.³ .............................. F26B 3/30; H05B 1/00
[52] U.S. Cl. ..................................... 219/388; 219/411;
219/405; 219/343; 219/347; 250/492.1
[58] Field of Search ............... 219/388, 354, 405, 411,
219/343, 347, 349, 85 BA, 85 BM; 250/492.1,
495, 504

[56] References Cited

U.S. PATENT DOCUMENTS

| 2,325,050 | 7/1943 | Goodwin | 219/349 |
| 2,565,570 | 8/1951 | Messinger | 219/354 |
| 3,879,164 | 4/1975 | Haldopoulos | 219/85 BA |
| 4,034,186 | 7/1977 | Bestenreiner | 219/388 |
| 4,049,947 | 9/1977 | Bestenreiner | 219/388 |

FOREIGN PATENT DOCUMENTS 264814 12/1927 United Kingdom ............... 219/347

Primary Examiner—B. A. Reynolds
Assistant Examiner—Teresa J. Walberg
Attorney, Agent, or Firm—Kenway & Jenney

[57] ABSTRACT

In the heat treating apparatus disclosed herein, a semiconductor wafer, held in a vacuum chuck, is traversed under an infrared source in which radiant energy from a linear, high intensity lamp is focused by an elongate elliptical reflector to generate a linear target zone through which the surface of the wafer is effectively scanned by the relative motion.

2 Claims, 4 Drawing Figures

APPARATUS FOR HEAT TREATING SEMICONDUCTOR WAFERS

BACKGROUND OF THE INVENTION

The present invention relates to apparatus for heat treating semiconductor wafers and more particularly to a high temperature bake suitable for dehydrating the surface of a silicon wafer as part of a process of manufacturing semiconductor integrated circuits.

Among the several objects of the present invention may be noted the provision of apparatus for heat treating semiconductor wafers; the provision of such apparatus which will effectively dehydrate the surface of a silicon wafer; the provision of such apparatus which will perform heat treatment quickly so that wafers may be treated individually rather than in batches; the provision of such apparatus which requires very little space; the provision of such apparatus which is highly reliable and which is of relatively simple and inexpensive construction. Other objects and features will be in part apparent and in part pointed out hereinafter.

SUMMARY OF THE INVENTION

Briefly, the apparatus of the present invention is intended to heat treat semiconductor wafers. During heat treatment, each wafer is held by a suitable chuck to which the wafer is brought for treatment by a suitable transport means. Transport means are also provided for removing treated wafers successively from the chuck. An infrared source is utilized which includes a linear high intensity lamp and an elongate elliptical reflector which focuses radiation from the lamp on a linear target zone. A relative scanning motion introduced between the chuck and the source causes the surface of a wafer, held in the chuck means, to be scanned through the zone.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
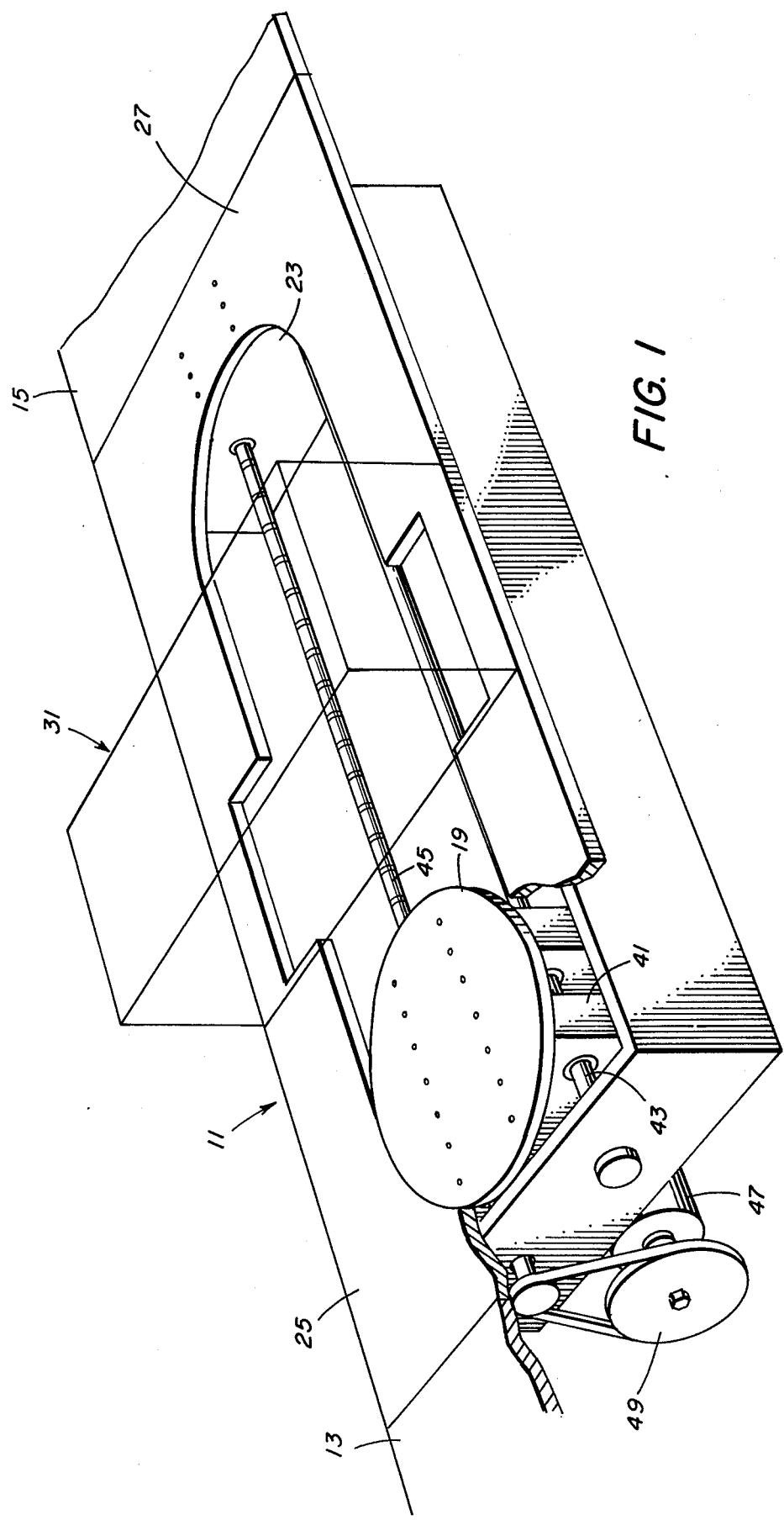
FIG. 1 is a view, in perspective, of heat treating apparatus constructed in accordance with the present invention.
Figure 2:
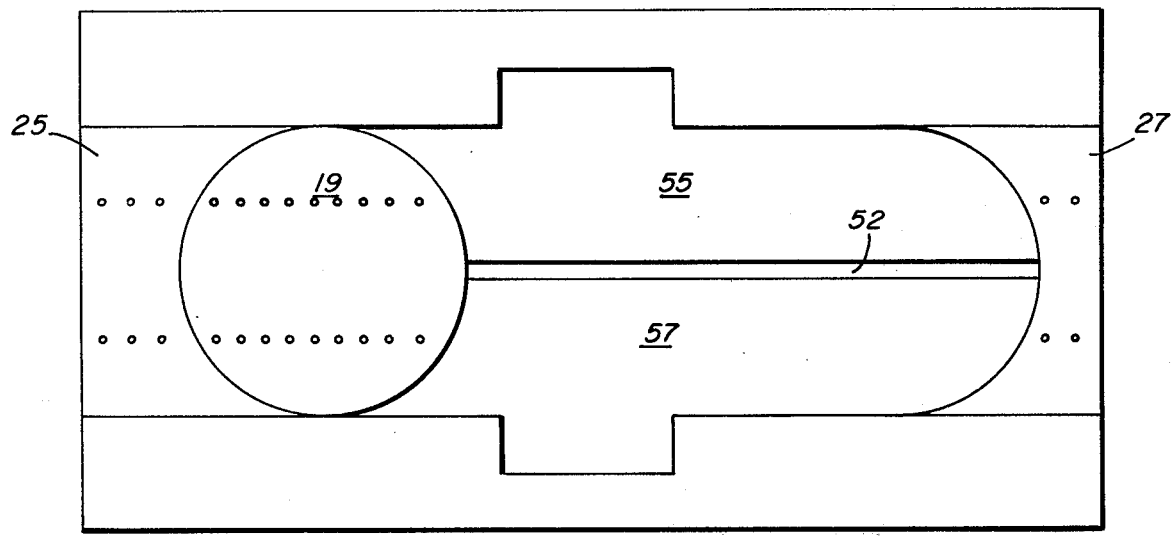
FIG. 2 is a top view of the apparatus of FIG. 1.

The heat treating apparatus of the present invention is preferably constructed as one module or station in an in-line semiconductor manufacturing process. For example, a system in which semiconductor wafers are transported from one module to another by an air track conveying system. Such overall systems are manufactured and sold by the GCA Corporation of Bedford, Massachusetts under the trademark WAFERTRACK. Such an arrangement is illustrated in FIG. 1 wherein the heat treating apparatus of the present invention is indicated generally by reference character 11 with air track sections 13 and 15 being provided for transporting semiconductor wafers to and from the heat treating station, respectively.

The heat treating apparatus comprises a circular vacuum chuck for holding a wafer to be treated, chuck 19 being essentially similar to the chucks which are conventionally used in such semiconductor manufacturing processes for holding wafers during a variety of treatments such as coating with resist and developing. Chuck 19 is movable from a first or input station, the position illustrated, to a second or output station, designated by reference character 23. The heat treating station itself includes a short section or air track 25 for loading a wafer onto the chuck when it is at the input station and a corresponding section 27 for taking a wafer from the chuck when it is at the output station 23. In moving between the input and output stations, the chuck travels in a constant plane, level with the input and output air tracks.

Figure 3:
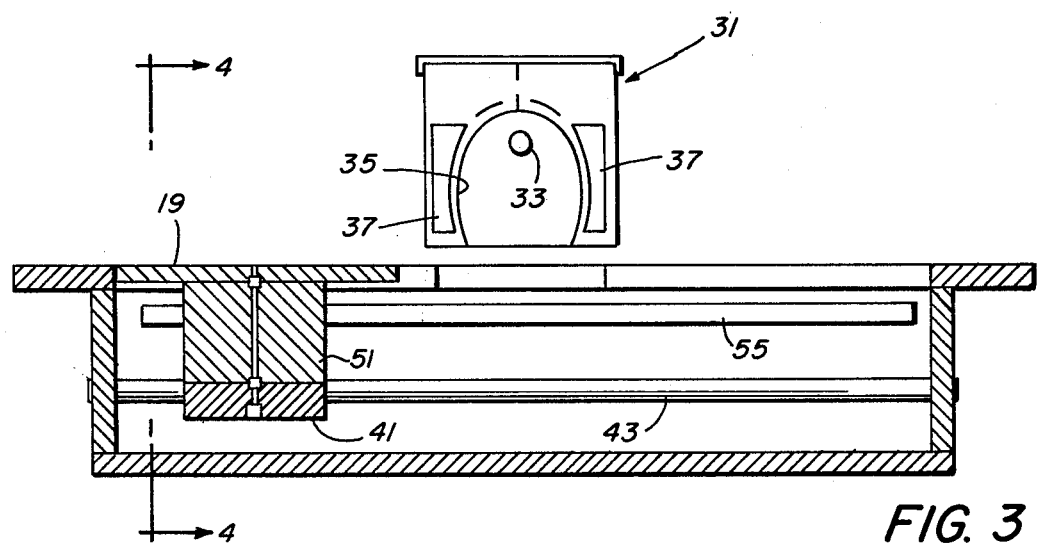
FIG. 3 is a side view of the apparatus of FIG. 1 with parts broken away.
Figure 4:
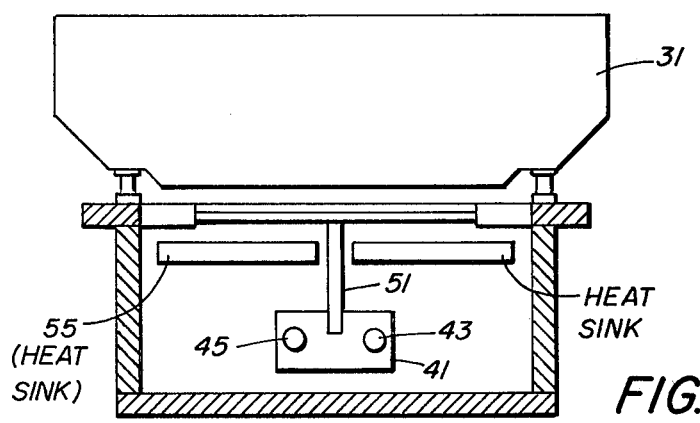
FIG. 4 is a cross-sectional view taken substantially on the line 4—4 of FIG. 3.

An infrared source, designated generally by a reference character 31 is mounted above the path of travel of the chuck at a position intermediate the input and output stations. As may best be seen in FIG. 3, the source 31 comprises a linear quartz lamp 33 supported in a reflector structure 35. The reflector is linearly aligned with the lamp and has an elliptical cross-section, as illustrated. The lamp 33 is at one focus of the ellipse thereby creating a linear target zone of concentrated heating at the other focus. This other focus is slightly spaced outside of and below the reflector's structure. In order to dissipate heat generated by the lamp, the reflector is provided with cooling passages 37 to which water is provided.

In moving between the input station 21 and the output station 23, the chuck 19 is transported by a carriage 41. Carriage 41 slides along a guide rod 43 and is driven by a lead screw 45. Lead screw 45 is controllably rotated by a stepping motor 47 coupled to the lead screw through a chain and sprocket drive as indicated at 49. The connection between the disc-like chuck 19 and the carriage 41 is constructed as a narrow web, indicated by reference character 51 in the drawings. As the chuck is moved, web 51 passes along a narrow gap 52 between a pair of plate-like heat sinks 55 and 57. Heat sinks 55 and 57 are constructed with heat conductive material such as aluminum and are water-cooled by means of interior passages (not shown). As may be seen, the heat sinks face the infrared source 31 from across the target zone and provide the function of soaking up lost radiant energy. This absorbtion minimizes heat loss into the adjacent environment of the semiconductor manufacturing process, where its effect might be deleterious. To provide maximum absorption of radiant energy, the upper surface of the heat sinks 55 and 57 is preferably blackened.

To similarly minimize the escape of heat from the heat treating station, a cover may be provided which comprises an inner reflector which re-directs radiant energy back into the heat treating station and an outer shell which is separated from the reflector by an air space to minimize the transfer of heat by conduction, i.e. for operator safety.

The operation of the heat treating station is as follows, starting with the chuck at the input or left hand position as illustrated. A semiconductor wafer to be treated is transported to the chuck 19 by air track sections 13 and 25 and is held on the chuck by the application of vacuum in conventional manner. Once the wafer has been acquired by the chuck 19, the lamp 33 is energized and the stepping motor 47 is operated to traverse the chuck from the input station 21 to the output station 23 at constant speed. As the chuck moves, the semiconductor wafer is in effect scanned through the linear target zone created by the focused radiation from the lamp. Successive points on the surface of the wafer are thus subjected, for a brief time interval, to a very intense radiant field which quickly raises its temperature to a point where dehydration occurs while introducing minimal other changes in the wafer's characteristics. After the wafer has passed through the target zone, the lamp is deenergized to minimize the generation of non-useful heat, and air jets in the chuck and the output air track sections 15 and 27 are energized to remove the treated wafer from the chuck and to pass it on for further processing.

As compared with conventional batch-processing oven systems, the apparatus of the present invention allows the surface wafers to be dehydrated on an in-line basis utilizing the brief application of higher temperatures than would be practicable in a batch process. Accordingly, wafers can be treated individually as part of a continuous in-line manufacturing process.

While the apparatus illustrated utilizes movement of the wafer on a chuck to effect scanning of the heating zone across the surface of the wafer, it should be understood that the relative motion could, alternatively, be implemented by moving the lamp with a wafer held stationary in an appropriate fixture.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for heat treating semiconductor wafers, said apparatus comprising:
   infrared source means including a linear high intensity lamp and a linear reflector focusing radiation from said lamp on a linear target zone;
   a vacuum chuck for holding a wafer to be treated;
   a heat sink on the opposite side of said zone from said lamp;
   means for traversing said chuck through the region between said source and said sink from a first station on one side of the course to a second station on the other side of said source thereby to cause said zone to sweep the surface of a wafer held by said chuck;
   air track means for transporting wafers to be treated to said chuck at said first station; and
   air track means for taking treated wafers away from said chuck at said second station.

2. Apparatus for heat treating semiconductor wafers, said apparatus comprising:
   infrared source means including a linear quartz lamp and a linear reflector incorporating cooling means for focusing radiation from said lamp on a linear target zone;
   a vacuum chuck for holding a wafer to be treated;
   a heat sink, on the opposite side of said zone from said lamp;
   means for traversing said chuck at a preselected speed through the region between said source and said sink from a first station on one side of the course to a second station on the other side of said source thereby to cause said zone to sweep the surface of a wafer held by said chuck;
   air track means for transporting wafers to be treated to said chuck at said first station; and
   air track means for taking treated wafers away from said chuck at said second station.

* * * * *